United States Patent
Duca et al.

(10) Patent No.: US 9,620,438 B2
(45) Date of Patent: Apr. 11, 2017

(54) ELECTRONIC DEVICE WITH HEAT DISSIPATER

(71) Applicants: STMicroelectronics (Malta) Ltd, Kirkop (MT); STMicroelectronics S.r.l., Agrate Brianza (IT); STMicroelectronics Pte Ltd, Singapore (SG)

(72) Inventors: Roseanne Duca, Ghaxaq (MT); Valter Motta, Paderno D'adda (IT); Xueren Zhang, Singapore (SG); Kim-Yong Goh, Singapore (SG)

(73) Assignees: STMICROELECTRONICS (MALTA) LTD, Kirkop (MT); STMICROELECTRONICS S.R.L., Agrate Brianza (IT); STMICROELECTRONICS PTE LTD, Singapore (SG)

( * ) Notice: Subject to any disclaimer, the term of this patent is extended or adjusted under 35 U.S.C. 154(b) by 0 days.

(21) Appl. No.: 14/615,673

(22) Filed: Feb. 6, 2015

(65) Prior Publication Data
US 2015/0235929 A1 Aug. 20, 2015

(30) Foreign Application Priority Data
Feb. 14, 2014 (IT) .............. MI2014A0212

(51) Int. Cl.
*H01L 23/02* (2006.01)
*H01L 23/495* (2006.01)

(52) U.S. Cl.
CPC .............. *H01L 23/49568* (2013.01)

(58) Field of Classification Search
USPC .............. 257/675, 625, 706, 717, 720, 796, 257/E23.101, E23.103, E23.105
See application file for complete search history.

(56) References Cited

U.S. PATENT DOCUMENTS

| 4,994,897 A | * | 2/1991 | Golubic | .............. H01L 23/4334 |
| | | | | 257/667 |
| 5,722,161 A | | 3/1998 | Marrs | |
| 6,246,111 B1 | * | 6/2001 | Huang | .................. H01L 21/565 |
| | | | | 257/666 |

FOREIGN PATENT DOCUMENTS

| JP | H06295963 A | 10/1994 |
| JP | H07130915 A | 5/1995 |

OTHER PUBLICATIONS

Italian Search Report and Written Opinion for IT MI2014A000212 dated Oct. 30, 2014 (8 pages).

* cited by examiner

*Primary Examiner* — Timor Karimy
(74) *Attorney, Agent, or Firm* — Gardere Wynne Sewell, LLP

(57) ABSTRACT

An electronic device includes an integrated circuit chip mounted to a heat slug. The heat slug has a peripheral region having first thickness along a first direction, the peripheral region surrounding a recess region (having a second, smaller, thickness along the first direction) that defines a chip mounting surface along a second direction perpendicular to the first direction. The recess region defines side borders and a nook extends into the heat slug along the side borders. An insulating body embeds the integrated circuit one chip and heat slug. Material of the insulating body fills the nook.

23 Claims, 2 Drawing Sheets

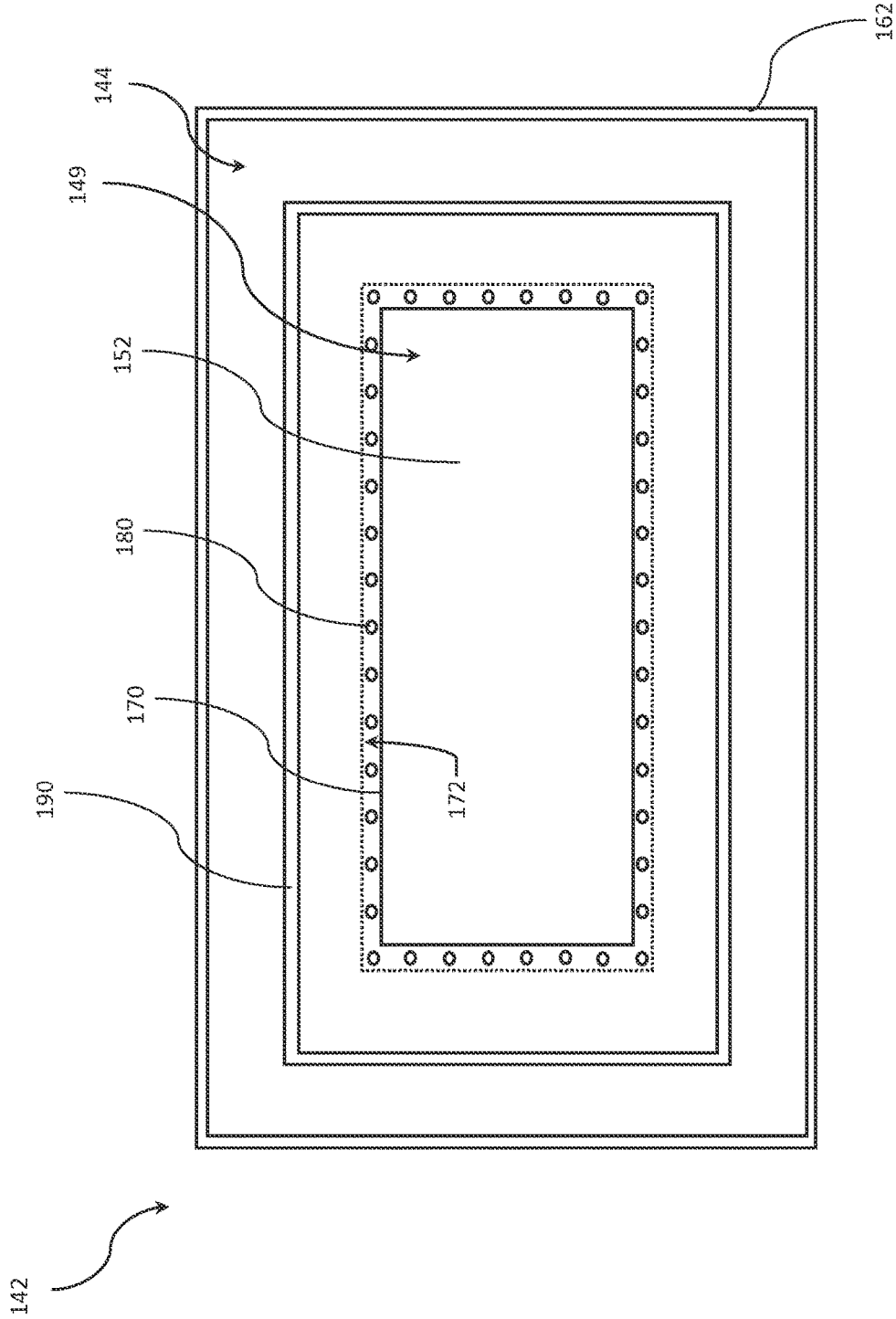

ELECTRONIC DEVICE WITH HEAT DISSIPATER

PRIORITY CLAIM

This application claims priority from Italian Application for Patent No. MI2014A000212 filed Feb. 14, 2014, the disclosure of which is incorporated by reference.

TECHNICAL FIELD

The embodiments disclosed relate to the electronic field and, more specifically, to an electronic device including a heat dissipation slug.

BACKGROUND

An electronic device typically comprises a semiconductor material chip on which one or more electric components are integrated, and a package wherein the chip is encapsulated for protecting it and for allowing access to terminals thereof.

In this respect, the package typically comprises an insulating body (for example made of resin) having exposed metallic leads, each one of which is electrically connected to a corresponding conductive terminal of the chip (for example, through a wire-bonding technique). The package leads are used for connecting the package (and hence the corresponding conductive terminals of the chip) to external circuits. For such purpose, the electronic device is usually mounted on a Printed Circuit Board (PCB), for example, by Surface Mounting Technology (SMT), wherein the package leads comprise flat pads that are fixed to corresponding conductive tracks of the PCB by means of a slight pressure (pick and place), and then reflowed on the same, or by Through-Hole Technology (THT), wherein the package leads comprise reophores that are inserted into through holes of the PCB and back-welded on it.

An electronic device for power applications (e.g., power supplies, DC to DC converters, and motor controllers), hereinafter simply referred to as a "power device", comprises one or more power components integrated in the chip. A very common class of power components is for example represented by MOS power transistors; the latter, being affected by high voltages (such as for example 5.5 V-850 V), are subjected to considerable heating during operation thereof. For this reason, the chip on which the power component is integrated needs a package that, in order to ensure adequate heat dissipation properties (so as to avoid the occurrence of overheating capable of causing chip malfunctioning or breakages), is provided with one or more heat-sinks for dissipating the heat generated by the chip during operation thereof to the outside.

A simple but effective heat-sink suitable for being employed in packages of power devices comprises one or more metal plates, also referred to as "heat slugs", each one contacting (at least a portion of) a surface of the chip. For example, the package may be provided with a heat slug extending between a surface of the chip and a mounting surface of the insulating body facing the PCB.

A typical industrial process for manufacturing a plurality of power devices comprising heat slugs provides for the execution of the following sequence of operations.

Making reference to SMT power devices (similar considerations may be however applied to THT power devices), the first operation involves the use of a common support structure (referred to as a "leadframe") in conductive material, for example copper, comprising for each power device to be manufactured a support cell for the chip of said power device, comprising a corresponding heat slug and corresponding junction sacrificial portions surrounding the heat slug. Lead blocks (precursors of the leads in the electronic devices) extend from the junction sacrificial portions towards the heat slugs. In the support structure, the heat slugs, the junction sacrificial portions and the lead blocks corresponding to the plurality of power devices are connected together to form a common single body (leadframe).

The next operation provides that for each power device to be manufactured a semiconductor material chip integrating the power components (e.g., a MOS power transistor) is mounted on a first surface of the corresponding heat slug. In jargon, this operation is called a "die attach".

The conductive terminals of each chip are then electrically coupled to ends of the corresponding lead blocks in the support structure, for example using interconnection wires, having circular cross-section, or interconnection twin leads, having rectangular cross-section, in conductive material. In jargon, this operation is called "wire bonding".

The next step provides for forming the insulating body of each power device by encapsulating the corresponding chip, the corresponding heat slug, and portions of the corresponding lead blocks into a corresponding insulating body, in such a way that at least a portion of a second surface of the heat slug opposite the first surface is exposed from a face of the insulating body (the mounting surface). This operation can be for example performed by injection molding of resin material on the support structure. This operation is called in jargon a "molding" operation.

The next operation, called in the jargon a "cropping" operation, provides for the separation of the power devices from the common support structure, by sectioning the lead blocks.

Similar considerations apply if the power devices are provided with a heat slug extending between a surface of the chip and a free surface of the insulating body opposite the mounting surface.

When a power device of the abovementioned type is subjected to thermal and/or mechanical stresses, such as for example during the operations directed to fix the power device to a PCB, the resin forming the insulating body may detach from the heat slug, causing delamination at the interface between the resin of the mounting surface of the insulating body and the borders of the exposed second surface of the heat slug. If the delamination propagates and reaches the chip, a crack may correspondingly form in the latter. Said crack in the chip may propagate in turn until reaching the active portion of the chip (i.e., the portion thereof wherein the components are located), causing a partial or complete breakdown of the power device.

In order to reduce the resin-heat slug detachment occurrences, known solutions provide for shaping side borders of the heat slug in such a way to exhibit a pronged profile comprising recessed and protruding portions, and for forming grooves in the first surface of the heat slug. In this way, during the molding operation directed to the formation of the insulating body, resin fills the grooves and the recessed portions of the profile of the heat slug, causing the insulating body and the heat slug to be interlocked. This results in an increased overall adhesion between the insulating body and the heat slug.

It has been noted that the increased adhesion between the insulating body and the heat slug obtainable with the above-mentioned known solutions may still not be sufficient to avoid that resin forming the insulating body detach from the heat slug when the power device is subjected to high thermal and/or mechanical stresses. Indeed, even with the presence of the pronged profile in the side borders of the heat slug and with the presence of grooves in the first surface of the heath slug, if the power device is subjected to severe thermal and/or mechanical stresses, a delamination at the interface between the resin of the mounting surface of the insulating body and the borders of the exposed second surface of the heat slug may still occur, and such delamination may still be able to propagate toward the chip, causing the formation of a crack in the latter.

There is a need in the art to provide an electronic device which is able to sustain also high thermal and/or mechanical stresses without causing possible delamination to reach the chip.

SUMMARY

One aspect relates to an electronic device comprising at least one chip wherein at least one electronic component is integrated and an insulating body embedding said at least one chip. The insulating body has a mounting surface for the mounting of the electronic device on a board. The electronic device further comprises a heat slug in contact with said at least one chip for dissipating heat generated by said at least one electronic component toward the mounting surface. The heat slug has a first thickness along a first direction perpendicular to the mounting surface. The heat slug is embedded in said insulating body with a bottom surface exposed from the insulating body at the mounting surface. The heat slug is provided with a recess that defines a recessed portion of the heat slug having a second thickness along the first direction lower than the first thickness. Said recess has a main surface, perpendicular to the first direction and opposed to the bottom surface, and side borders. Said at least one chip is in contact with the main surface of the recess. Said recess comprises nooks extending inward the heat slug from said side borders.

According to an embodiment, said side borders are slanted with respect to the first direction.

According to an embodiment, said nooks have a substantially triangular profile along a plane perpendicular to the main surface.

According to an embodiment, the recess has a rectangular shape in plan view and comprises four side borders; the nooks extending inward the heat slug from each one of said side borders being connected to each other to form a continuous nook surrounding the main surface.

According to an embodiment, said recess comprises a plurality of holes extending inward the heat slug from the main surface.

According to an embodiment, the holes of the plurality are arranged on the main surface to surround said at least one chip.

According to an embodiment, the holes of the plurality are located at borders of the main surface.

According to an embodiment, the heat slug comprises a groove extending inward the heat slug and surrounding the recess.

According to an embodiment, the electronic device is a power device for power applications, and the at least one chip integrate at least a power MOS transistor.

Another aspect relates to a leadframe.

BRIEF DESCRIPTION OF THE DRAWINGS

These, and others, features and advantages of the solution will be better understood by reading the following detailed description of some embodiments thereof, provided merely by way of exemplary and non-limitative examples, to be read in conjunction with the attached drawings, wherein:

FIG. 2 is a plan view of an heat slug of the electronic device of FIG. 1 according to an embodiment.

DETAILED DESCRIPTION OF THE DRAWINGS

Figure 1:
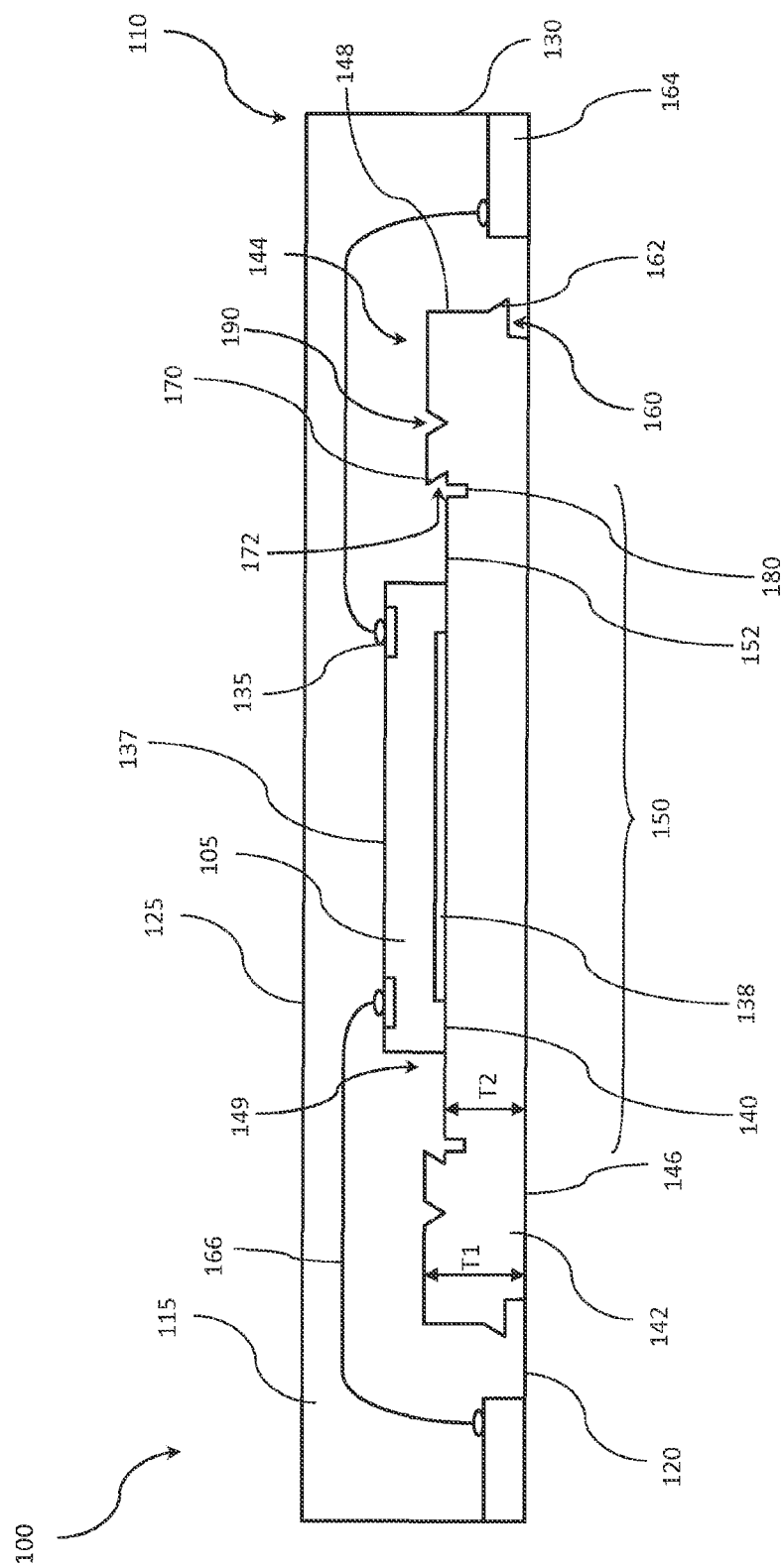
FIG. 1 is a sectional view of an electronic device according to an embodiment.

With reference to the drawings, FIG. 1 discloses a schematic sectional view of an electronic device 100 according to an embodiment.

The electronic device 100 comprises one or more chips 105 of semiconductor material, in each of which one or more electronic components (not illustrated in this figure) are integrated, and a package 110 for encapsulating said one or more chips 105.

In the exemplary but not limitative described embodiment, the electronic device 100 is a power device 100 for power applications (e.g., power supplies, DC to DC converters, and motor controllers) and comprises a single chip 105 on which one or more power components are integrated (e.g., a power MOS transistor having operating voltages between 5.5 V and 850 V).

The package 110 comprises a generally parallelepiped-shaped insulating body (e.g., of resin) 115, which embeds the chip 105. The insulating body 115 has a bottom, mounting surface 120 for mounting the power device 100 on a PCB, not shown in the figure, a top surface 125 opposite to the mounting surface 120, and side surfaces 130 perpendicular to the mounting surface 120 and to the top surface 125.

The chip 105 has conductive terminals 135 (two illustrated in the figure) on a top surface 137 of the chip 105 facing the top surface 125 of the insulating body 115 (for example a source and a gate terminal of the power MOS transistor). The chip 105 may further comprise conductive terminals 138 (one illustrated in the figure) on a bottom surface 140 of the chip 105 facing the mounting surface 120 of the insulating body 115 (for example a drain terminal of the power MOS transistor).

The package 110 further comprises a heat slug 142 for dissipating the heat generated by the chip 105. The heat slug 142 is a plate of conductive material having a top face 144 facing the top surface 125 of the insulating body 115, an opposite bottom face 146 and side borders 148 perpendicular to the top face 144 and to the bottom face 146. The thickness of the heat slug 142 along a direction perpendicular to the bottom face 146 is depicted in figure with reference T1. The heat slug 142 comprises a recess 149 extending inward the heat slug 142 from a portion of the top face 144 toward the bottom face 146 of the heat slug 142, in such a way to define a recessed portion 150 of the heat slug 142 having a thickness T2 lower than the thickness T1. The recess 149 has a main surface 152 (defining the top surface of the recessed portion 150) facing the top surface 125 of the insulating body 115, and side borders 170 surrounding the main surface 152. In the embodiment illustrated in figure, the recess 149 is located at a central portion of the top face 144.

The chip 105 is mounted on the main surface 152 of the recess 149, with the main surface 152 that contacts the conductive terminal 138 of the chip 105.

The heat slug 142 is arranged so that its bottom surface 146 is exposed from the mounting surface 120 of the insulating body 115 for allowing heat generated by the chip 105 to be dissipated outside the insulating body 115.

In order to increase the adhesion between the heat slug 142 and the insulating body 115, the side borders 148 of the heat slug 142 exhibit a pronged profile adapted to mechanically interlock with the resin forming the insulating body 115; in the illustrated embodiment, the side borders 148 comprise a recessed groove 160 and a protruding tooth member 162.

The package 110 further comprises a plurality of leads 164 which are connected to respective conductive terminals 135 on the top surface 137 of the chip 105 (for making the latter accessible from the external of the power device 100) and are suitable to allow the mounting of the power device 100 on the PCB by SMT. The leads 164 are arranged along edges (two in the figure) of the insulating body 115, and are formed each one by a generally square-shaped exposed pad of metal material that is exposed partially from the mounting surface 120 and partially from a side surface 130 of the insulating body 115. The leads 164 are in electrical contact with the conductive terminals 135 through wire bonding connection elements 166.

In the embodiment illustrated in FIG. 1, the conductive terminal 138 on the bottom surface is electrically connected with the heat slug 142, so that the exposed bottom surface 146 of the latter act both as lead for accessing the conductive terminal 138 and as heat dissipation surface. The bottom surface 146 exposed from the mounting surface 120 of the insulating body 115 is suitable to allow the mounting of the power device 100 on the PCB by SMT, like the leads 154.

According to an embodiment, in order to increase the adhesion between the heat slug 142 and the insulating body 115, the recess 149 comprises nooks 172 extending inward the heat slug 142 from corresponding side borders 170 thereof.

In the embodiment illustrated in FIG. 1, the side borders 170 of the recess 149 are slanted with respect to the direction perpendicular to the main surface 152 in such a way to define nooks 172 having a substantially triangular profile along a section plane perpendicular to the main surface 152. The nooks 172 are adapted to be filled with resin during the molding operation directed to the formation of the insulating body 115, causing the latter to be strongly interlocked with the heat slug 142, increasing the overall adhesion between the insulating body 115 and the heat slug 142.

FIG. 2 is a plan view of the heat slug 142 of FIG. 1 according to an embodiment taken from a plane parallel to the main surface 152. According to this embodiment, the recess 149 has a rectangular shape in plan view, with four side borders 170 that define four corresponding nooks 172. In the embodiment illustrated in FIG. 2, said four nooks 172 are connected to each other to form a continuous nook surrounding the main surface 152.

Similar considerations apply if the nooks 172 corresponding to different side borders 170 are separated to each other and do not form a single continuous nook that surrounds the main surface 152. Furthermore, although in the embodiment illustrated in FIG. 2 each nook 172 extends inward the heat slug 142 from the entire length of the corresponding side border 170, similar considerations apply if each nook 172 extends inward the heat slug 142 only from portions of the corresponding side border 170.

Since according to the embodiments the chip 105 is mounted on the main surface 152, the mechanical strengthening effect generated by the presence of the nooks 172 efficiently protects the chip 105 from possible delamination occurrences between the resin of the insulating body 115 and the heat slug 142. Indeed, even if the resin of the insulating body 115 started to detach from the heat slug 142 because of thermal and/or mechanic stresses, such detaching would initiate at the interface between the resin of the mounting surface 120 of the insulating body 115 and borders of the exposed bottom surface 146 of the heat slug 142. Before reaching the chip 105, such detachment should overtake both the resin-heat slug coupling at the side borders 148 of the heat slug 142 and the resin-heat slug coupling at the nooks 172.

In order to still further increase the adhesion between the heat slug 142 and the insulating body 115, according to an embodiment, the main surface 152 of the recess 149 may be provided with a plurality of holes 180 extending inward the heat slug 142 along a direction perpendicular to the main surface 152 and adapted to be filled with resin during the molding operation directed to the formation of the insulating body 115. The holes 180 are preferably arranged in such a way to surround the chip 105. For example, the holes 180 may be located at the borders of the main surface 152, close to the nooks 172.

According to an embodiment, in order to still further increase the adhesion between the heat slug 142 and the insulating body 115, a groove 190 extending inward the heat slug 142 from the top face 144 of the heat slug 142 and surrounding the recess 149 may be provided, adapted to be filled with resin during the molding operation directed to the formation of the insulating body 115.

In order to manufacture at least one electronic device 100 according to the embodiment, the operations of the industrial process previously described are carried out by exploiting a common support structure (leadframe) comprising for each electronic device 100 a heat slug 142 provided with the recess 149, the nooks 172 and possibly the holes 180.

For example, the recess 149, the nooks 172 and the holes 180 may be obtained by subjecting the leadframe to a selective chemical etching operation, or by means of a grinding or milling operation.

Naturally, in order to satisfy local and specific requirements, a person skilled in the art may apply to the solution described above many logical and/or physical modifications and alterations.

For example, although in the description reference has been made to an electronic device comprising a single chip on which a power MOS transistor is integrated, similar considerations apply if the chip integrates one or more electronic components, also different from power MOS transistors, and if the electronic device comprises more than one chips, each one integrating one or more electronic components, also different from power MOS transistors.

Moreover, even if reference has been explicitly made to an electronic device in which the chip has a conductive terminal located on the bottom surface thereof and that is electrically connected with the heat slug, the concepts can be applied as well to electronic devices in which the chip has conductive terminals located only on the top surface thereof.

Similar considerations apply in case the package has a different structure, for example with an insulating body having a different shape, and/or including leads of different type, for example comprising reophores adapted to be inserted into through holes of the PCB and back-welded on it.

Moreover, even if in the description the side borders of the recess have been described as slanted to define nooks with a triangular profile, similar considerations apply if the nooks have a different shape, such as for example with a rectangular profile.

Furthermore, the concepts of the present invention may be also applied to a heat slug in which the nooks are provided only at some side borders of the recess. Similar considerations apply to the holes, which also may extend inward the heat slug along a direction different from the one perpendicular to the main surface.

What is claimed is:

1. An electronic device, comprising:
   at least one chip wherein at least one electronic component is integrated;
   an insulating body embedding said at least one chip, the insulating body having a mounting surface configured to mount the electronic device on a board;
   a heat slug in contact with said at least one chip and configured to dissipate heat generated by said at least one electronic component toward the mounting surface, the heat slug having a first thickness along a first direction perpendicular to the mounting surface, the heat slug being embedded in said insulating body with a bottom surface exposed from the insulating body at the mounting surface, wherein:
      the heat slug is provided with a recess that defines a recessed portion of the heat slug having a second thickness along the first direction smaller than the first thickness;
      said recess having a main surface, perpendicular to the first direction and opposed to the bottom surface, and side borders;
      said at least one chip is in contact with the main surface of the recess;
      said recess comprising nooks extending into said side borders.

2. The electronic device of claim 1, wherein said side borders are slanted with respect to the first direction.

3. The electronic device of claim 2, wherein said nooks have a substantially triangular profile along a plane perpendicular to the main surface.

4. The electronic device of claim 1, wherein the recess has a rectangular shape in plan view and comprises four side borders, the nooks extending inward the heat slug from each one of said side borders being connected to each other to form a continuous nook surrounding the main surface.

5. The electronic device of claim 1, wherein said recess comprises a plurality of holes extending inward the heat slug from the main surface.

6. The electronic device of claim 5, wherein the holes are arranged on the main surface to surround said at least one chip.

7. The electronic device of claim 6, wherein the holes are located at borders of the main surface.

8. The electronic device of claim 1, wherein the heat slug comprises a groove extending inward the heat slug and surrounding the recess.

9. The electronic device of claim 1, wherein the electronic device is a power device for power applications, and the at least one chip integrates at least a power MOS transistor.

10. A leadframe for use in manufacturing at least one electronic device, wherein said leadframe comprises a heat slug for each electronic device, said heat slug having a first thickness along a first direction perpendicular to a mounting surface, wherein:
    the heat slug is provided with a recess that defines a recessed portion of the heat slug having a second thickness along the first direction smaller than the first thickness;
    said recess having a main surface, perpendicular to the first direction and opposed to the bottom surface, and side borders;
    said main surface of the recess configured to support an integrated circuit; and
    said recess comprising nooks extending into said side borders.

11. The leadframe of claim 10, wherein said side borders are slanted with respect to the first direction.

12. The leadframe of claim 11, wherein said nooks have a substantially triangular profile along a plane perpendicular to the main surface.

13. The leadframe of claim 10, wherein the recess has a rectangular shape in plan view and comprises four side borders, the nooks extending inward the heat slug from each one of said side borders being connected to each other to form a continuous nook surrounding the main surface.

14. The leadframe of claim 10, wherein said recess comprises a plurality of holes extending inward the heat slug from the main surface.

15. The leadframe of claim 14, wherein the holes are arranged on the main surface to surround said main surface.

16. The leadframe of claim 14, wherein the holes are located at borders of the main surface.

17. The leadframe of claim 10, wherein the heat slug comprises a groove extending inward the heat slug and surrounding the recess.

18. An electronic device, comprising:
    an integrated circuit chip;
    a heat slug having a peripheral region having a first thickness along a first direction perpendicular to a mounting surface and a recess region surrounded by the peripheral region and having a second thickness along the first direction smaller than the first thickness, the recess region defining a chip mounting surface, the heat slug further including a side border of the recess region extending around the chip mounting surface;
    wherein said integrated circuit chip is mounted to said chip mounting surface;
    said recess region including a nook extending into said side border at the peripheral region in a second direction perpendicular to the first direction; and
    an insulating body embedding said integrated circuit chip and the heat slug, wherein material of the insulating body fills said nook.

19. The device of claim 18, wherein said nook is defined by a slanted surface.

20. The device of claim 19, wherein the slanted surface defines a triangular shape for the nook in cross-section taken by a plane perpendicular to the chip mounting surface.

21. The device of claim 18, wherein the recess region has a rectangular shape in plan view and comprises four side borders, wherein the nook extends from each of said side borders.

22. The device of claim 18, further comprising a plurality of holes extending into the heat slug in the first direction from the chip mounting surface.

23. The device of claim 18, further comprising a groove formed in the peripheral region surrounding the recess.

* * * * *